(12) United States Patent
Rice et al.

(10) Patent No.: US 9,407,015 B1
(45) Date of Patent: Aug. 2, 2016

(54) AUTOMATIC POWER DISCONNECT DEVICE

(71) Applicant: Western Digital Technologies, Inc., Irvine, CA (US)

(72) Inventors: Alan P. Rice, North Tustin, CA (US); Andre Pratama, Tustin, CA (US); Jeffrey Alan Wilson, Garden Grove, CA (US); Firouz Felfeli, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/585,111

(22) Filed: Dec. 29, 2014

(51) Int. Cl.
H01R 4/02 (2006.01)
H01R 12/72 (2011.01)
H05K 3/34 (2006.01)

(52) U.S. Cl.
CPC .............. *H01R 4/027* (2013.01); *H01R 12/722* (2013.01); *H05K 3/3405* (2013.01); *H05K 2203/04* (2013.01)

(58) Field of Classification Search
CPC .... H01R 4/027; H01R 12/722; H01R 12/724; H01R 23/7073; H05K 3/3405; H05K 2203/04
USPC ........................................ 439/83, 79, 80, 876
See application file for complete search history.

(56) References Cited

U.S. PATENT DOCUMENTS

| | | | |
|---|---|---|---|
| 4,628,410 A * | 12/1986 | Goodman | H05K 3/341 361/776 |
| 4,914,267 A | 4/1990 | Derbyshire | |
| 4,992,052 A * | 2/1991 | Verhoeven | H01R 12/721 439/62 |
| 5,823,799 A * | 10/1998 | Tor | H01R 12/7023 439/79 |
| 5,876,222 A * | 3/1999 | Gardner | H01R 12/724 439/607.2 |
| 5,897,386 A * | 4/1999 | Baxter | G11B 33/122 439/79 |
| 6,014,283 A | 1/2000 | Codilian et al. | |
| 6,052,076 A | 4/2000 | Patton, III et al. | |
| 6,052,250 A | 4/2000 | Golowka et al. | |
| 6,067,206 A | 5/2000 | Hull et al. | |
| 6,078,453 A | 6/2000 | Dziallo et al. | |
| 6,091,564 A | 7/2000 | Codilian et al. | |
| 6,094,020 A | 7/2000 | Goretzki et al. | |
| 6,101,065 A | 8/2000 | Alfred et al. | |
| 6,104,153 A | 8/2000 | Codilian et al. | |
| 6,122,133 A | 9/2000 | Nazarian et al. | |
| 6,122,135 A | 9/2000 | Stich | |
| 6,141,175 A | 10/2000 | Nazarian et al. | |
| 6,160,368 A | 12/2000 | Plutowski | |
| 6,181,502 B1 | 1/2001 | Hussein et al. | |
| 6,195,222 B1 | 2/2001 | Heminger et al. | |
| 6,198,584 B1 | 3/2001 | Codilian et al. | |

(Continued)

*Primary Examiner* — Abdullah Riyami
*Assistant Examiner* — Nelson R Burgos-Guntin

(57) ABSTRACT

Systems and methods are disclosed for automatically disconnecting a power source in an electronic device. A data storage device is disclosed comprising a printed circuit board (PCB) and an electrical connector secured to the PCB, the electrical connector including a power pin having a power input contact portion configured to receive power from a communication interface connector, a substantially straight portion connected between the power input contact portion and a bend in the power pin, and an output arm connected between the bend at a first end and a power output contact portion at a second end, the power output contact portion being configured to be electrically coupled to the PCB via an electrical connection medium. The bend causes the output arm to lift away from the PCB when a bond between the power output contact portion and the electrical connection medium is broken.

9 Claims, 6 Drawing Sheets

(56) References Cited

U.S. PATENT DOCUMENTS

| | | |
|---|---|---|
| 6,198,590 B1 | 3/2001 | Codilian et al. |
| 6,204,988 B1 | 3/2001 | Codilian et al. |
| 6,243,223 B1 | 6/2001 | Elliott et al. |
| 6,281,652 B1 | 8/2001 | Ryan et al. |
| 6,285,521 B1 | 9/2001 | Hussein |
| 6,292,320 B1 | 9/2001 | Mason et al. |
| 6,310,742 B1 | 10/2001 | Nazarian et al. |
| 6,320,718 B1 | 11/2001 | Bouwkamp et al. |
| 6,342,984 B1 | 1/2002 | Hussein et al. |
| 6,347,018 B1 | 2/2002 | Kadlec et al. |
| 6,369,972 B1 | 4/2002 | Codilian et al. |
| 6,369,974 B1 | 4/2002 | Asgari et al. |
| 6,462,896 B1 | 10/2002 | Codilian et al. |
| 6,476,996 B1 | 11/2002 | Ryan |
| 6,484,577 B1 | 11/2002 | Bennett |
| 6,493,169 B1 | 12/2002 | Ferris et al. |
| 6,496,324 B1 | 12/2002 | Golowka et al. |
| 6,498,698 B1 | 12/2002 | Golowka et al. |
| 6,507,450 B1 | 1/2003 | Elliott |
| 6,534,936 B2 | 3/2003 | Messenger et al. |
| 6,538,839 B1 | 3/2003 | Ryan |
| 6,545,835 B1 | 4/2003 | Codilian et al. |
| 6,549,359 B1 | 4/2003 | Bennett et al. |
| 6,549,361 B1 | 4/2003 | Bennett et al. |
| 6,560,056 B1 | 5/2003 | Ryan |
| 6,568,268 B1 | 5/2003 | Bennett |
| 6,574,062 B1 | 6/2003 | Bennett et al. |
| 6,577,465 B1 | 6/2003 | Bennett et al. |
| 6,614,615 B1 | 9/2003 | Ju et al. |
| 6,614,618 B1 | 9/2003 | Sheh et al. |
| 6,636,377 B1 | 10/2003 | Yu et al. |
| 6,690,536 B1 | 2/2004 | Ryan |
| 6,693,764 B1 | 2/2004 | Sheh et al. |
| 6,707,635 B1 | 3/2004 | Codilian et al. |
| 6,710,953 B1 | 3/2004 | Vallis et al. |
| 6,710,966 B1 | 3/2004 | Codilian et al. |
| 6,714,371 B1 | 3/2004 | Codilian |
| 6,714,372 B1 | 3/2004 | Codilian et al. |
| 6,724,564 B1 | 4/2004 | Codilian et al. |
| 6,731,450 B1 | 5/2004 | Codilian et al. |
| 6,735,041 B1 | 5/2004 | Codilian et al. |
| 6,738,220 B1 | 5/2004 | Codilian |
| 6,747,837 B1 | 6/2004 | Bennett |
| 6,758,685 B1 * | 7/2004 | Huang ............... H01R 13/6658 439/79 |
| 6,760,186 B1 | 7/2004 | Codilian et al. |
| 6,788,483 B1 | 9/2004 | Ferris et al. |
| 6,791,785 B1 | 9/2004 | Messenger et al. |
| 6,795,268 B1 | 9/2004 | Ryan |
| 6,819,518 B1 | 11/2004 | Melkote et al. |
| 6,826,006 B1 | 11/2004 | Melkote et al. |
| 6,826,007 B1 | 11/2004 | Patton, III |
| 6,847,502 B1 | 1/2005 | Codilian |
| 6,850,383 B1 | 2/2005 | Bennett |
| 6,850,384 B1 | 2/2005 | Bennett |
| 6,867,944 B1 | 3/2005 | Ryan |
| 6,876,508 B1 | 4/2005 | Patton, III et al. |
| 6,882,496 B1 | 4/2005 | Codilian et al. |
| 6,885,514 B1 | 4/2005 | Codilian et al. |
| 6,900,958 B1 | 5/2005 | Yi et al. |
| 6,900,959 B1 | 5/2005 | Gardner et al. |
| 6,903,897 B1 | 6/2005 | Wang et al. |
| 6,914,740 B1 | 7/2005 | Tu et al. |
| 6,914,743 B1 | 7/2005 | Narayana et al. |
| 6,920,004 B1 | 7/2005 | Codilian et al. |
| 6,924,959 B1 | 8/2005 | Melkote et al. |
| 6,924,960 B1 | 8/2005 | Melkote et al. |
| 6,924,961 B1 | 8/2005 | Melkote et al. |
| 6,934,114 B1 | 8/2005 | Codilian et al. |
| 6,934,135 B1 | 8/2005 | Ryan |
| 6,937,420 B1 | 8/2005 | McNab et al. |
| 6,937,423 B1 | 8/2005 | Ngo et al. |
| 6,952,322 B1 | 10/2005 | Codilian et al. |
| 6,954,324 B1 | 10/2005 | Tu et al. |
| 6,958,881 B1 | 10/2005 | Codilian et al. |
| 6,963,465 B1 | 11/2005 | Melkote et al. |
| 6,965,488 B1 | 11/2005 | Bennett |
| 6,967,458 B1 | 11/2005 | Bennett et al. |
| 6,967,811 B1 | 11/2005 | Codilian et al. |
| 6,970,319 B1 | 11/2005 | Bennett et al. |
| 6,972,539 B1 | 12/2005 | Codilian et al. |
| 6,972,540 B1 | 12/2005 | Wang et al. |
| 6,972,922 B1 | 12/2005 | Subrahmanyam et al. |
| 6,975,480 B1 | 12/2005 | Codilian et al. |
| 6,977,789 B1 | 12/2005 | Cloke |
| 6,980,389 B1 | 12/2005 | Kupferman |
| 6,987,636 B1 | 1/2006 | Chue et al. |
| 6,987,639 B1 | 1/2006 | Yu |
| 6,989,954 B1 | 1/2006 | Lee et al. |
| 6,992,848 B1 | 1/2006 | Agarwal et al. |
| 6,992,851 B1 | 1/2006 | Cloke |
| 6,992,852 B1 | 1/2006 | Ying et al. |
| 6,995,941 B1 | 2/2006 | Miyamura et al. |
| 6,999,263 B1 | 2/2006 | Melkote et al. |
| 6,999,267 B1 | 2/2006 | Melkote et al. |
| 7,006,320 B1 | 2/2006 | Bennett et al. |
| 7,016,134 B1 | 3/2006 | Agarwal et al. |
| 7,023,637 B1 | 4/2006 | Kupferman |
| 7,023,640 B1 | 4/2006 | Codilian et al. |
| 7,027,256 B1 | 4/2006 | Subrahmanyam et al. |
| 7,027,257 B1 | 4/2006 | Kupferman |
| 7,035,026 B2 | 4/2006 | Codilian et al. |
| 7,046,472 B1 | 5/2006 | Melkote et al. |
| 7,050,249 B1 | 5/2006 | Chue et al. |
| 7,050,254 B1 | 5/2006 | Yu et al. |
| 7,050,258 B1 | 5/2006 | Codilian |
| 7,054,098 B1 | 5/2006 | Yu et al. |
| 7,061,714 B1 | 6/2006 | Yu |
| 7,064,918 B1 | 6/2006 | Codilian et al. |
| 7,068,451 B1 | 6/2006 | Wang et al. |
| 7,068,459 B1 | 6/2006 | Cloke et al. |
| 7,068,461 B1 | 6/2006 | Chue et al. |
| 7,068,463 B1 | 6/2006 | Ji et al. |
| 7,088,547 B1 | 8/2006 | Wang et al. |
| 7,095,579 B1 | 8/2006 | Ryan et al. |
| 7,110,208 B1 | 9/2006 | Miyamura et al. |
| 7,110,214 B1 | 9/2006 | Tu et al. |
| 7,113,362 B1 | 9/2006 | Lee et al. |
| 7,113,365 B1 | 9/2006 | Ryan et al. |
| 7,116,505 B1 | 10/2006 | Kupferman |
| 7,126,781 B1 | 10/2006 | Bennett |
| 7,158,329 B1 | 1/2007 | Ryan |
| 7,180,703 B1 | 2/2007 | Subrahmanyam et al. |
| 7,184,230 B1 | 2/2007 | Chue et al. |
| 7,196,864 B1 | 3/2007 | Yi et al. |
| 7,199,966 B1 | 4/2007 | Tu et al. |
| 7,203,021 B1 | 4/2007 | Ryan et al. |
| 7,209,321 B1 | 4/2007 | Bennett |
| 7,212,364 B1 | 5/2007 | Lee |
| 7,212,374 B1 | 5/2007 | Wang et al |
| 7,215,504 B1 | 5/2007 | Bennett |
| 7,224,546 B1 | 5/2007 | Orakcilar et al. |
| 7,248,426 B1 | 7/2007 | Weerasooriya et al. |
| 7,251,098 B1 | 7/2007 | Wang et al. |
| 7,253,582 B1 | 8/2007 | Ding et al. |
| 7,253,989 B1 | 8/2007 | Lau et al. |
| 7,265,933 B1 | 9/2007 | Phan et al. |
| 7,289,288 B1 | 10/2007 | Tu |
| 7,298,574 B1 | 11/2007 | Melkote et al. |
| 7,301,717 B1 | 11/2007 | Lee et al. |
| 7,304,819 B1 | 12/2007 | Melkote et al. |
| 7,330,019 B1 | 2/2008 | Bennett |
| 7,330,327 B1 | 2/2008 | Chue et al. |
| 7,333,280 B1 | 2/2008 | Lifchits et al. |
| 7,333,290 B1 | 2/2008 | Kupferman |
| 7,339,761 B1 | 3/2008 | Tu et al. |
| 7,365,932 B1 | 4/2008 | Bennett |
| 7,388,728 B1 | 6/2008 | Chen et al. |
| 7,391,583 B1 | 6/2008 | Sheh et al. |
| 7,391,584 B1 | 6/2008 | Sheh et al. |
| 7,433,143 B1 | 10/2008 | Ying et al. |
| 7,440,210 B1 | 10/2008 | Lee |
| 7,440,225 B1 | 10/2008 | Chen et al. |
| 7,450,334 B1 | 11/2008 | Wang et al. |

(56) References Cited

U.S. PATENT DOCUMENTS

| | | |
|---|---|---|
| 7,450,336 B1 | 11/2008 | Wang et al. |
| 7,453,661 B1 | 11/2008 | Jang et al. |
| 7,457,071 B1 | 11/2008 | Sheh |
| 7,466,509 B1 | 12/2008 | Chen et al. |
| 7,468,855 B1 | 12/2008 | Weerasooriya et al. |
| 7,477,471 B1 | 1/2009 | Nemshick et al. |
| 7,480,116 B1 | 1/2009 | Bennett |
| 7,489,464 B1 | 2/2009 | McNab et al. |
| 7,492,546 B1 | 2/2009 | Miyamura |
| 7,495,857 B1 | 2/2009 | Bennett |
| 7,499,236 B1 | 3/2009 | Lee et al. |
| 7,502,192 B1 | 3/2009 | Wang et al. |
| 7,502,195 B1 | 3/2009 | Wu et al. |
| 7,502,197 B1 | 3/2009 | Chue |
| 7,505,223 B1 | 3/2009 | McCornack |
| 7,542,225 B1 | 6/2009 | Ding et al. |
| 7,548,392 B1 | 6/2009 | Desai et al. |
| 7,551,390 B1 | 6/2009 | Wang et al. |
| 7,558,016 B1 | 7/2009 | Le et al. |
| 7,573,670 B1 | 8/2009 | Ryan et al. |
| 7,576,941 B1 | 8/2009 | Chen et al. |
| 7,580,212 B1 | 8/2009 | Li et al. |
| 7,583,470 B1 | 9/2009 | Chen et al. |
| 7,595,954 B1 | 9/2009 | Chen et al. |
| 7,602,575 B1 | 10/2009 | Lifchits et al. |
| 7,616,399 B1 | 11/2009 | Chen et al. |
| 7,619,844 B1 | 11/2009 | Bennett |
| 7,626,782 B1 | 12/2009 | Yu et al. |
| 7,630,162 B2 | 12/2009 | Zhao et al. |
| 7,639,447 B1 | 12/2009 | Yu et al. |
| 7,656,604 B1 | 2/2010 | Liang et al. |
| 7,656,607 B1 | 2/2010 | Bennett |
| 7,660,067 B1 | 2/2010 | Ji et al. |
| 7,663,835 B1 | 2/2010 | Yu et al. |
| 7,675,707 B1 | 3/2010 | Liu et al. |
| 7,679,854 B1 | 3/2010 | Narayana et al. |
| 7,688,534 B1 | 3/2010 | McCornack |
| 7,688,538 B1 | 3/2010 | Chen et al. |
| 7,688,539 B1 | 3/2010 | Bryant et al. |
| 7,697,233 B1 | 4/2010 | Bennett et al. |
| 7,701,661 B1 | 4/2010 | Bennett |
| 7,710,676 B1 | 5/2010 | Chue |
| 7,715,138 B1 | 5/2010 | Kupferman |
| 7,729,079 B1 | 6/2010 | Huber |
| 7,733,189 B1 | 6/2010 | Bennett |
| 7,746,592 B1 | 6/2010 | Liang et al. |
| 7,746,594 B1 | 6/2010 | Guo et al. |
| 7,746,595 B1 | 6/2010 | Guo et al. |
| 7,760,461 B1 | 7/2010 | Bennett |
| 7,800,853 B1 | 9/2010 | Guo et al. |
| 7,800,856 B1 | 9/2010 | Bennett et al. |
| 7,800,857 B1 | 9/2010 | Calaway et al. |
| 7,839,591 B1 | 11/2010 | Weerasooriya et al. |
| 7,839,595 B1 | 11/2010 | Chue et al. |
| 7,839,600 B1 | 11/2010 | Babinski et al. |
| 7,843,662 B1 | 11/2010 | Weerasooriya et al. |
| 7,852,588 B1 | 12/2010 | Ferris et al. |
| 7,852,592 B1 | 12/2010 | Liang et al. |
| 7,864,481 B1 | 1/2011 | Kon et al. |
| 7,864,482 B1 | 1/2011 | Babinski et al. |
| 7,869,155 B1 | 1/2011 | Wong |
| 7,876,522 B1 | 1/2011 | Calaway et al. |
| 7,876,523 B1 | 1/2011 | Panyavoravaj et al. |
| 7,916,415 B1 | 3/2011 | Chue |
| 7,916,416 B1 | 3/2011 | Guo et al. |
| 7,916,420 B1 | 3/2011 | McFadyen et al. |
| 7,916,422 B1 | 3/2011 | Guo et al. |
| 7,929,238 B1 | 4/2011 | Vasquez |
| 7,961,422 B1 | 6/2011 | Chen et al. |
| 8,000,053 B1 | 8/2011 | Anderson |
| 8,031,423 B1 | 10/2011 | Tsai et al. |
| 8,054,022 B1 | 11/2011 | Ryan et al. |
| 8,059,357 B1 | 11/2011 | Knigge et al. |
| 8,059,360 B1 | 11/2011 | Melkote et al. |
| 8,072,703 B1 | 12/2011 | Calaway et al. |
| 8,077,428 B1 | 12/2011 | Chen et al. |
| 8,078,901 B1 | 12/2011 | Meyer et al. |
| 8,081,395 B1 | 12/2011 | Ferris |
| 8,085,020 B1 | 12/2011 | Bennett |
| 8,116,023 B1 | 2/2012 | Kupferman |
| 8,145,934 B1 | 3/2012 | Ferris et al. |
| 8,179,626 B1 | 5/2012 | Ryan et al. |
| 8,189,286 B1 | 5/2012 | Chen et al. |
| 8,213,106 B1 | 7/2012 | Guo et al. |
| 8,254,222 B1 | 8/2012 | Tang |
| 8,300,348 B1 | 10/2012 | Liu et al. |
| 8,315,005 B1 | 11/2012 | Zou et al. |
| 8,320,069 B1 | 11/2012 | Knigge et al. |
| 8,351,174 B1 | 1/2013 | Gardner et al. |
| 8,358,114 B1 | 1/2013 | Ferris et al. |
| 8,358,145 B1 | 1/2013 | Ferris et al. |
| 8,390,367 B1 | 3/2013 | Bennett |
| 8,432,031 B1 | 4/2013 | Agness et al. |
| 8,432,629 B1 | 4/2013 | Rigney et al. |
| 8,451,697 B1 | 5/2013 | Rigney et al. |
| 8,482,873 B1 | 7/2013 | Chue et al. |
| 8,498,076 B1 | 7/2013 | Sheh et al. |
| 8,498,172 B1 | 7/2013 | Patton, III et al. |
| 8,508,881 B1 | 8/2013 | Babinski et al. |
| 8,531,263 B2 | 9/2013 | Dietsch et al. |
| 8,531,798 B1 | 9/2013 | Xi et al. |
| 8,537,486 B2 | 9/2013 | Liang et al. |
| 8,542,455 B2 | 9/2013 | Huang et al. |
| 8,553,351 B1 | 10/2013 | Narayana et al. |
| 8,564,899 B2 | 10/2013 | Lou et al. |
| 8,576,506 B1 | 11/2013 | Wang et al. |
| 8,605,382 B1 | 12/2013 | Mallary et al. |
| 8,605,384 B1 | 12/2013 | Liu et al. |
| 8,610,391 B1 | 12/2013 | Yang et al. |
| 8,611,040 B1 | 12/2013 | Xi et al. |
| 8,619,385 B1 | 12/2013 | Guo et al. |
| 8,630,054 B2 | 1/2014 | Bennett et al. |
| 8,630,059 B1 | 1/2014 | Chen et al. |
| 8,634,154 B1 | 1/2014 | Rigney et al. |
| 8,634,283 B1 | 1/2014 | Rigney et al. |
| 8,643,976 B1 | 2/2014 | Wang et al. |
| 8,649,121 B1 | 2/2014 | Smith et al. |
| 8,654,466 B1 | 2/2014 | McFadyen |
| 8,654,467 B1 | 2/2014 | Wong et al. |
| 8,665,546 B1 | 3/2014 | Zhao et al. |
| 8,665,551 B1 | 3/2014 | Rigney et al. |
| 8,670,206 B1 | 3/2014 | Liang et al. |
| 8,684,752 B2 * | 4/2014 | Hsueh ............... H01R 12/721 439/79 |
| 8,687,312 B1 | 4/2014 | Liang |
| 8,693,123 B1 | 4/2014 | Guo et al. |
| 8,693,134 B1 | 4/2014 | Xi et al. |
| 8,699,173 B1 | 4/2014 | Kang et al. |
| 8,711,027 B1 | 4/2014 | Bennett |
| 8,717,696 B1 | 5/2014 | Ryan et al. |
| 8,717,699 B1 | 5/2014 | Ferris |
| 8,717,704 B1 | 5/2014 | Yu et al. |
| 8,724,245 B1 | 5/2014 | Smith et al. |
| 8,724,253 B1 | 5/2014 | Liang et al. |
| 8,724,524 B2 | 5/2014 | Urabe et al. |
| 8,737,008 B1 | 5/2014 | Watanabe et al. |
| 8,737,013 B2 | 5/2014 | Zhou et al. |
| 8,743,495 B1 | 6/2014 | Chen et al. |
| 8,743,503 B1 | 6/2014 | Tang et al. |
| 8,743,504 B1 | 6/2014 | Bryant et al. |
| 8,749,904 B1 | 6/2014 | Liang et al. |
| 8,760,796 B1 | 6/2014 | Lou et al. |
| 8,767,332 B1 | 7/2014 | Chahwan et al. |
| 8,767,343 B1 | 7/2014 | Helmick et al. |
| 8,767,354 B1 | 7/2014 | Ferris et al. |
| 8,773,787 B1 | 7/2014 | Beker |
| 8,779,574 B1 | 7/2014 | Agness et al. |
| 8,780,473 B1 | 7/2014 | Zhao et al. |
| 8,780,477 B1 | 7/2014 | Guo et al. |
| 8,780,479 B1 | 7/2014 | Helmick et al. |
| 8,780,489 B1 | 7/2014 | Gayaka et al. |
| 8,792,202 B1 | 7/2014 | Wan et al. |

(56) References Cited

U.S. PATENT DOCUMENTS

| | | |
|---|---|---|
| 8,797,664 B1 | 8/2014 | Guo et al. |
| 8,804,267 B2 | 8/2014 | Huang et al. |
| 8,824,081 B1 | 9/2014 | Guo et al. |
| 8,824,262 B1 | 9/2014 | Liu et al. |
| 2003/0153201 A1* | 8/2003 | Burger .................. H01R 43/20 439/79 |
| 2004/0023531 A1* | 2/2004 | Wu ........................ H01R 13/40 439/79 |
| 2004/0115971 A1* | 6/2004 | Nose .................... H01R 12/712 439/79 |
| 2006/0057870 A1* | 3/2006 | Inui ....................... H05K 1/117 439/79 |
| 2006/0234530 A1* | 10/2006 | Chung .................... H05K 3/341 439/79 |
| 2007/0042618 A1* | 2/2007 | Aihara ............... H01R 43/0256 439/79 |
| 2007/0155201 A1* | 7/2007 | Ellison ................. H01R 12/722 439/79 |
| 2009/0011623 A1* | 1/2009 | Hisamatsu ........... H01R 12/707 439/79 |
| 2010/0035085 A1 | 2/2010 | Jung et al. |
| 2010/0045421 A1 | 2/2010 | Dauth et al. |
| 2010/0112835 A1* | 5/2010 | Matsunaga .......... H01R 13/703 439/79 |
| 2012/0284493 A1 | 11/2012 | Lou et al. |
| 2013/0120870 A1 | 5/2013 | Zhou et al. |
| 2013/0148240 A1 | 6/2013 | Ferris et al. |

* cited by examiner

AUTOMATIC POWER DISCONNECT DEVICE

BACKGROUND

1. Field

This disclosure relates to electrical connectors. More particularly, the disclosure relates to systems and methods for managing power transmission using an electrical connector.

2. Description of Related Art

Physical electrical connector structures and devices can be used to electrically couple electronic devices to one another. Excess current in electrical connectors or other electronic components can cause physical damage or other adverse consequences to electronic devices.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
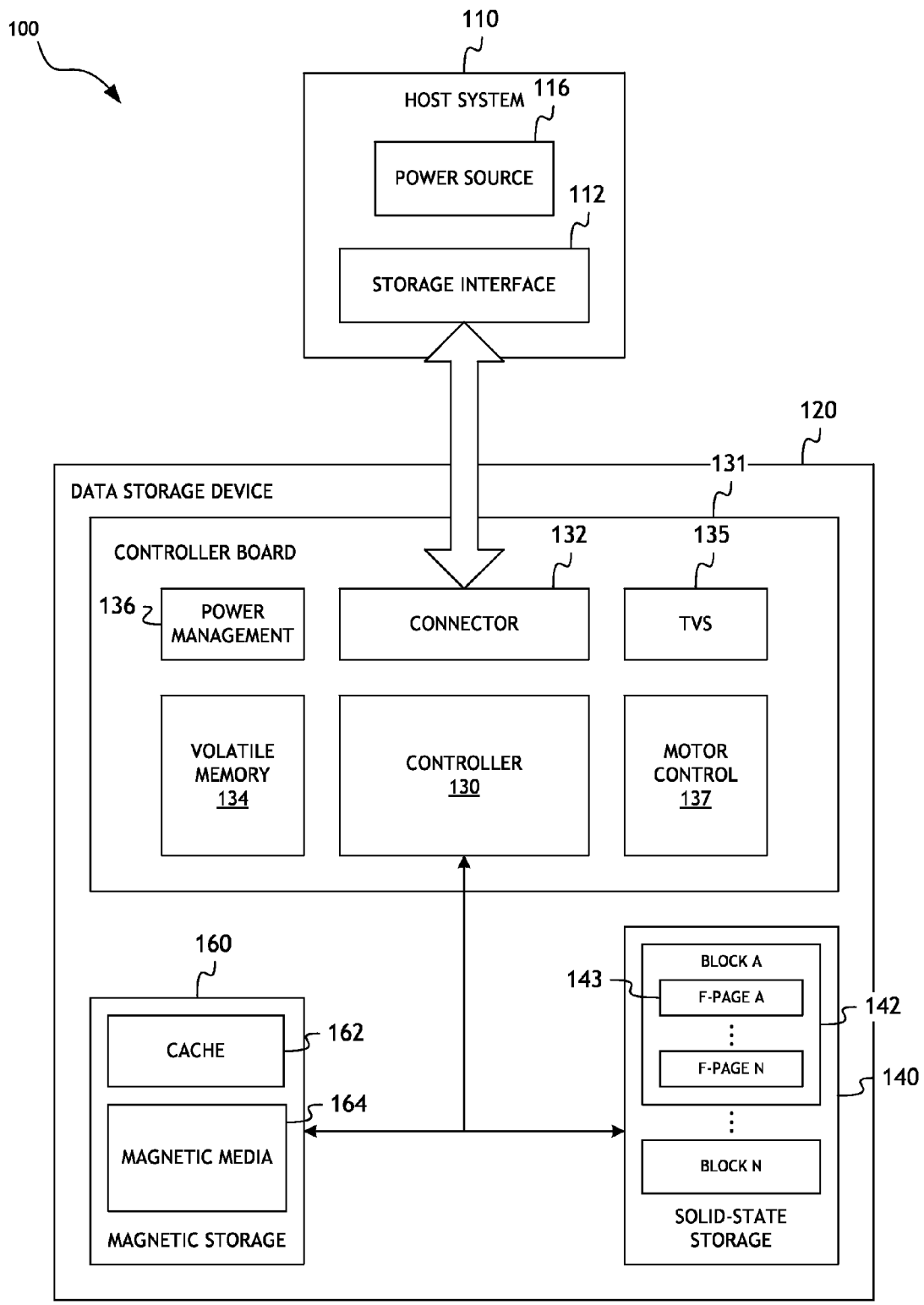
FIG. 1 is a block diagram representing a data storage system according to one or more embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to automatic power disconnection in electronic devices.

Overview

Certain embodiments disclosed herein provide systems and/or methods of automatically disconnecting or disabling one or more power transmission lines in an electronic device, such as a data storage device, in the event of an electrical short or component failure that could otherwise result in a fire or other damage at or to a component of the electronic device, such as an electrical interface connector of the electronic device. Principles and embodiments disclosed herein may at least partially assist with achieving compliance with certain electronic device safety standards.

Various electrical devices are configured to receive power over a physical interface connector configured to connect an off-board power source to a board (e.g., printed circuit board assembly (PCBA)) or other component of the device. For example, power may be provided to one or more power pins of the interface connector, wherein the connector is electrically coupled to the PCBA. Power is transmitted over one or more conductive traces of the PCBA to various components of the PCBA. In certain situations, the transmission path of the power between the physical connector and one or more other components or devices disposed on the board can become compromised in some manner. For example, defects or other conditions of the board and/or electronic device or environment may cause the transmission path to be effectively shorted to ground, thereby increasing the draw of power over the transmission line potentially beyond the physical limits of the transmission path and/or components of the electrical device in thermal or electrical connection therewith.

Overheating in electronic devices can cause a variety of adverse consequences. For example, overheating may result in one or more components of the electronic device catching fire or otherwise being damaged by high temperatures. Furthermore, excessive heat and/or fire can present a risk of burn or other injury to persons or other living things, as well as substantial damage to property, including both the electronic devices and other structures or property disposed within proximity of the electronic device. The risk of connector fire or other heat-related damage may be exacerbated when low-quality power connectors are used.

Certain embodiments disclosed herein at least partially alleviate risks of power shorts or component failures resulting in connector fires caused by the high current and temperature in the connectors. For example, systems and methods are disclosed that provide a relatively low cost mechanism for preventing fires/overheating by using the heat present in power pins of an electrical interface connector that may otherwise directly or indirectly lead to fire to cause automatic disconnection of power between the connector and the PCBA the power. For example, one or more power pins of the connector may be spring-loaded such that when heat in the pin(s) melts a solder or other bonding electrical connection between the pin(s) and the PCBA, the pin(s) have a tendency to pull away from the PCBA, thereby severing the electrical connection between power pin(s) and the PCBA. The automatic disconnection of the power pin(s) from the PCBA may prevent further overheating of the connector and/or components of the board that draw power from the connector.

Data Storage System

FIG. 1 is a block diagram illustrating an embodiment of a combination of a host system 110 with a data storage device 120 incorporating automatic power disconnection functionality in accordance with embodiments disclosed herein. As shown, the data storage device 120 (e.g., hybrid hard drive, solid-state drive, any storage device utilizing solid-state memory, etc.) includes a controller 130 configured to receive data commands from the host system 110 and execute such commands in one or more magnetic or solid-state storage modules. Such commands may include data read/write commands, and the like. The controller 130 may be configured to receive data commands from a storage interface (e.g., a device driver) 112 residing on the host system 110. Data commands may specify physical or logical addresses in the data storage device 120; data may be accessed/transferred based on such commands.

The data storage device 120 can store data received from the host system 110 such that the data storage device 120 acts as data storage for the host system 110. To facilitate this function, the controller 130 may implement a logical interface. The logical interface can present to the host system memory as a set of logical addresses (e.g., sequential/contiguous addresses) where data can be stored. Internally, the controller 130 can map logical addresses to various physical memory addresses in the magnetic storage 160, solid-state storage 140 and/or other memory module(s). Mapping data indicating the mapping of logical addresses to physical memory addresses may be maintained in the data storage device 120. For example, mapping table data may be stored in non-volatile storage in order to allow for recreation of mapping tables following a power cycle.

The controller 130 may include one or more memory modules, such as non-volatile memory (e.g., ROM) and/or volatile memory 134 (e.g., RAM, such as DRAM). In certain embodiments, the controller 130 may be configured to store information, including, for example, operating system(s) code, application code, system tables and/or other data, in the non-volatile storage 140/160. On power-up, the controller 130 may be configured to load such data for use in operation of the data storage device. The controller 130 may receive memory access commands from the host system 110 and implement such in the magnetic storage 160 or non-volatile solid-state storage 140. As used herein, "non-volatile solid-state storage," "non-volatile memory," "NVM," or variations thereof may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips.

The connector 132 may be configured to physically couple with a corresponding connector associated with, for example, a cable connected between the host system 110 and the data storage device 120, and receive power therefrom over one or more power pins of the connector 132. The power received by the connector 132 may be provided to one or more components of the controller board 131 and/or magnetic storage 160 and solid-state storage 140 via electrically conductive transmission lines (e.g., traces) of the controller board 131. However, in certain conditions, relatively high currents may occur in connection with the power transmission path(s), which may be caused by, for example, power shorts and/or component failures; certain high currents can result in a fire or other heat-related damage to the controller board 131 and/or data storage device 120, such as a connector fire due to relatively high electrical resistance in the connector 132. In certain embodiments, the risk of fire from excess electrical current may be at least partially alleviated through the use of one or more fuses or other electrical disconnects. For example, an electrical fuse (not shown) may be disposed at a point along the power transmission line, wherein the fuse is configured to break the power circuit at such point in the presence of current and/or voltage levels above a certain threshold. However, there are some circumstances where a fuse may not provide sufficient protection, such as where the region subject to excess current is upstream of the position of the fuse (e.g., where the connector itself is involved).

Certain embodiments disclosed herein provide for the use of the connector pins of the connector 132 themselves to provide automatic power disconnection. For example, certain embodiments disclosed herein provide electrical connector structures/devices configured to automatically disconnect one or more spring-loaded power pins of the connector from a board or other device or component to which the power pin(s) are mounted. The power pins and/or connector 132 may be configured such that when excessive current in a power pin causes a substantial increase in thermal energy in the power pin and/or the power signal transmission path, the power pin is configured to melt an electrical connection medium (e.g., solder) formed to couple the pin to the board or device. Melting of electrical connection medium may allow for the spring-loaded pin to automatically pull away from the board device, thereby severing an electrical connection therebetween, such that electrical current no longer flows to the board or device via the power pin. For example, one or more power pins may be bent, or have one or more bend features, that cause spring-loading in the pin(s), such that when they are not bound or secured to the board, they naturally angle away from the board. In certain embodiments, automatic power disconnection as described herein may at least partially reduce risk of damage to electrical components and/or physical harm to persons.

Electrical Connector

Figure 2A:
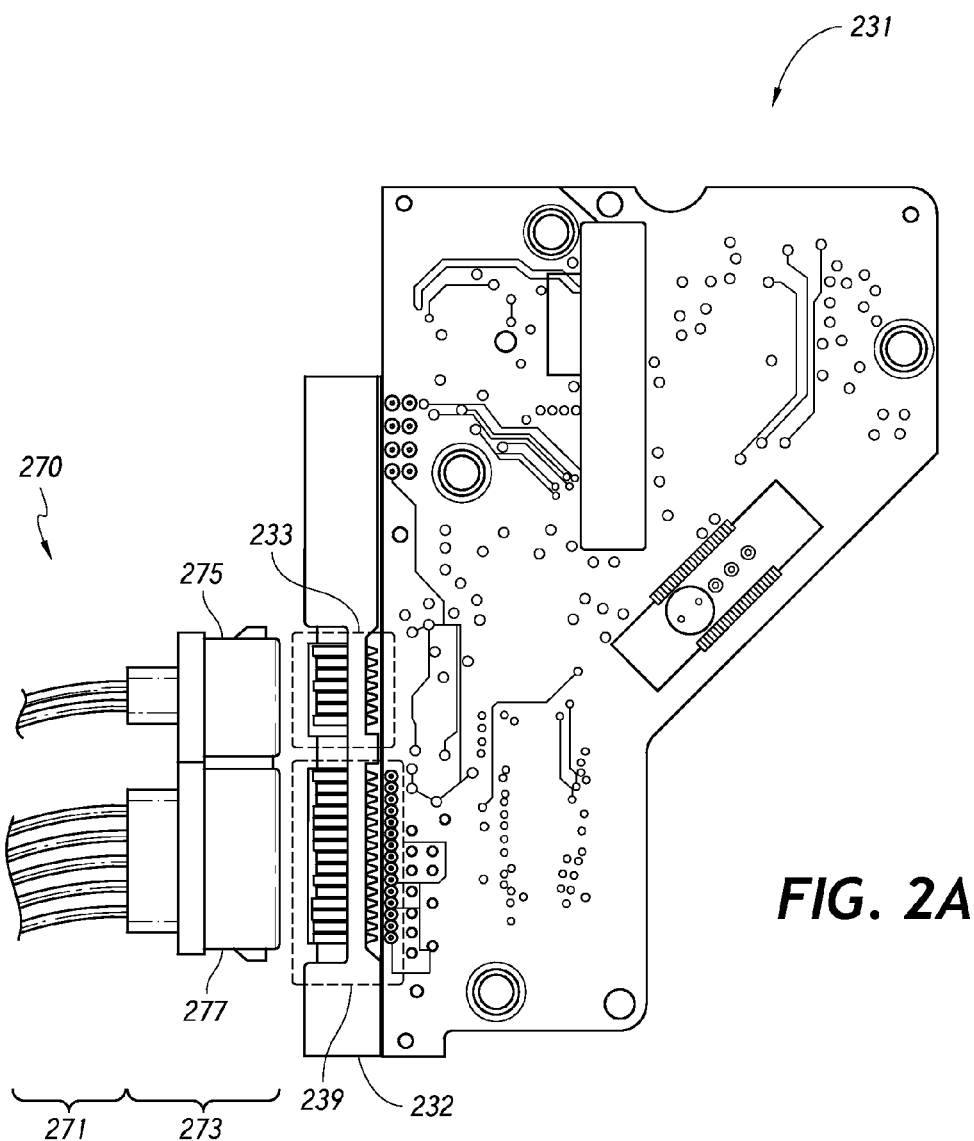
FIGS. 2A and 2B provide back and front views, respectively, of a controller board for an electronic device in accordance with one or more embodiments.
Figure 2B:
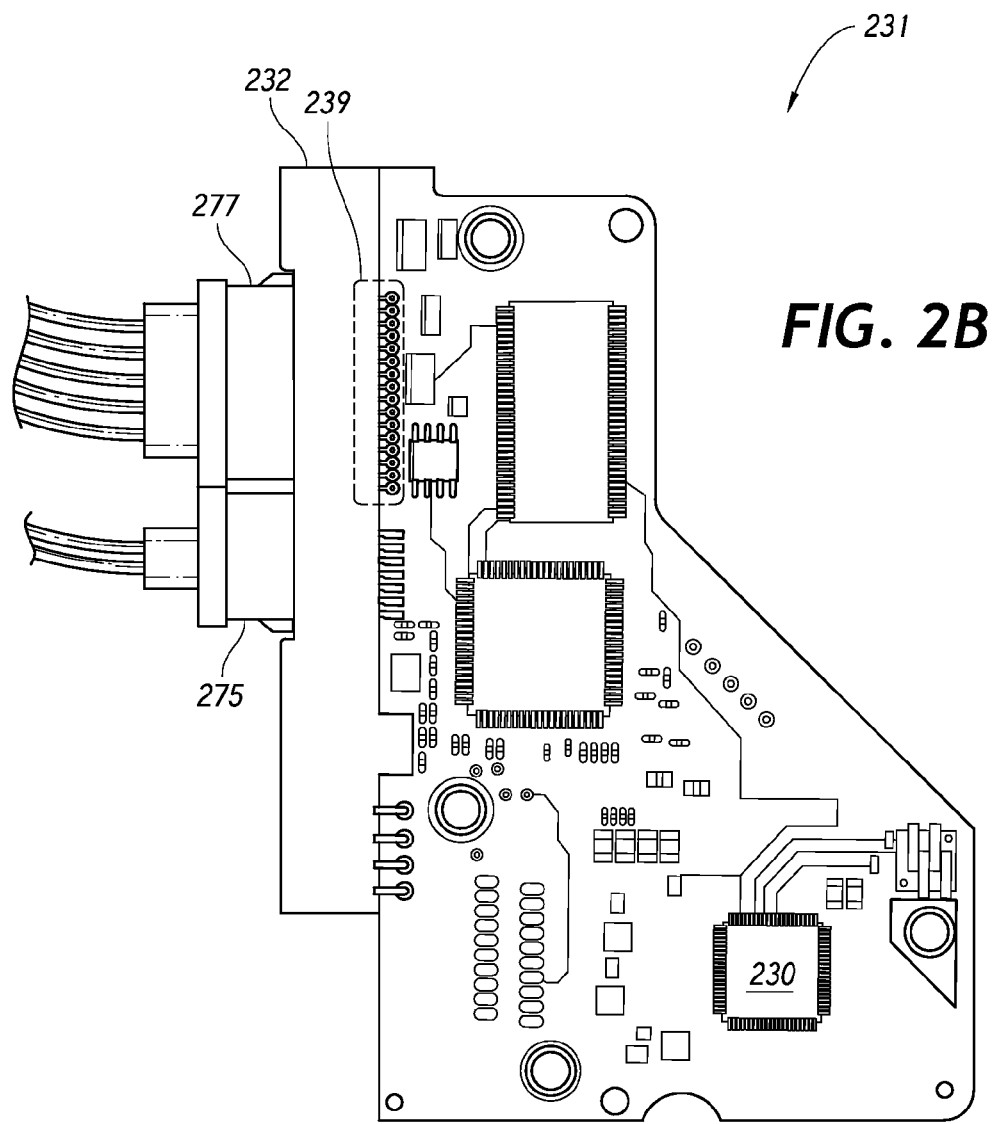

FIGS. 2A and 2B provide back and front views, respectively, of a controller board for an electronic device in accordance with one or more embodiments. For example, FIG. 2A shows an underside of a controller board 231 for a data storage device, wherein an electrical connector port or structure 232 is mounted or disposed on the board 231. The board 231 may be a printed circuit board assembly (PCBA), having mounted thereto one or more electronic devices and/or chips, such as integrated circuit (IC) chips, as well as other passive and/or active electronic devices. The PCBA 231 may further include electrical traces running therethrough. For example the PCBA 231 may comprise a plurality of layers, wherein electrically conductive traces may be formed or disposed within one or more layers of the board. The traces (not called out in FIG. 2A) may allow for communication of data and/or power signals between various devices of the PCBA 231 and/or between the various devices of the PCBA 231 and external devices via electrical interfaces, such as the electrical interface port 232. One or more of the components of the PCBA 231 may be configured to receive power over one or more transmission lines or traces of the PCBA 231.

In certain embodiments, the connector structure 232 may present an interface consistent with one or more data communication standards. For example, the connector 232 may comprise a serial advanced technology attachment ("SATA") connector, as illustrated. Although the embodiment of FIG. 2A illustrates a SATA connector, those skilled in the art will understand that principles disclosed herein may be applicable to any suitable or desirable electrical connection interface configured to provide power and/or data signals. For example, the connector 232 may be a peripheral component interconnect ("PCI") or PCI express ("PCI-e") connector, universal serial bus ("USB") connector, small computer system interface ("SCSI") connector, Thunderbolt connector, or any other type of connector including at least one power pin.

The diagram of FIG. 2A shows a SATA cable 270 having a cable portion 271 and a connector portion 273. The cable 270 further comprises a data transmission portion 275 as well as a power transmission portion 277, wherein each of the data transmission portion and the power transmission portion may be configured to provide parallel signals to the board 231 via a plurality of pins of the electrical connector 232. The pins of the electrical connector 232 may include a plurality of data pins 233 as well as a plurality of power pins 239. The various pins of the connector 232 may be at least partially contained within the housing of the connector 232, and at least partially exposed, such that electrical contact may be made with the exposed portions of the plurality of pins. For example, a power pin of the connector 232 may include a power input contact portion which may be exposed in such a manner as to allow a corresponding pin or contact in the power portion 277 of the cable 270 to make electrical contact therewith, thereby allowing power signals to be transmitted between the cable 270 and the connector 232.

The power pins 239 of the connector 232 may further be electrically coupled to one or more regions or portions of the board 231. For example one or more of the power pins 239 may be positioned to come in electrical contact with one or more traces or transmission lines of the board 231. For example, such electrical contact may be facilitated using a bonding agent or other electrical connection medium, such as solder or the like. Electrically conductive solder may have such properties as to allow for at least partial melting of the solder through the application of thermal energy above a particular threshold; therefore, the one or more power pins may be caused to breach or penetrate the solder in an at least partially melted state, wherein upon cooling and/or hardening of the solder, a secure electrical bond at least partially encases an output contact portion of the power pins, thereby allowing for electrical charge to flow through the power pin and into one or more traces of the PCBA 231 via the electrical connection medium (e.g., solder).

The diagram of FIG. 2A illustrates the cable 270 in a detached state with respect to the connector 232 and the PCBA 231. In order to effect electrical communication between the cable 270 and the PCBA 231, the cable 270 may be made to be matingly engaged with the connector 232 in a manner as to allow for electrical contact between pins of the cable 270 and pins of the connector 232, as described herein.

FIG. 2B illustrates an upper view of the PCBA 231 described above with reference to FIG. 2A; FIG. 2B likewise illustrates the connector 232, which includes a plurality of power pins 239. An output contact portion of each of the plurality of power pins 239 may be configured to contact and be mounted to an electrical contact surface of the PCBA 231. Power received over the power pins 239 may be transferred via one or more conductive traces of the PCBA 231 to one or more components of the PCBA. For example, the PCBA 231 may include an integrated circuit chip 230 (e.g., a VLSI chip). If the VLSI chip 230 experiences a failure that causes it to draw excess current, fire or other damage may result.

Various testing and/or safety standards (e.g., EN60065/UL60065) may require certain operational standards with respect to fire risk and other heat-related damage risks. Therefore, implementation of automatic power disconnection features/principles disclosed herein may help meet such standards by at least partially preventing connector and/or other fires caused by high current and temperature in the connectors associated with power shorts or component failures. Furthermore, embodiments disclosed herein may provide a relatively low cost solution to prevent such fires before they can start by using the heat that would otherwise potentially cause the fire to automatically disconnect the power.

Figure 3A:
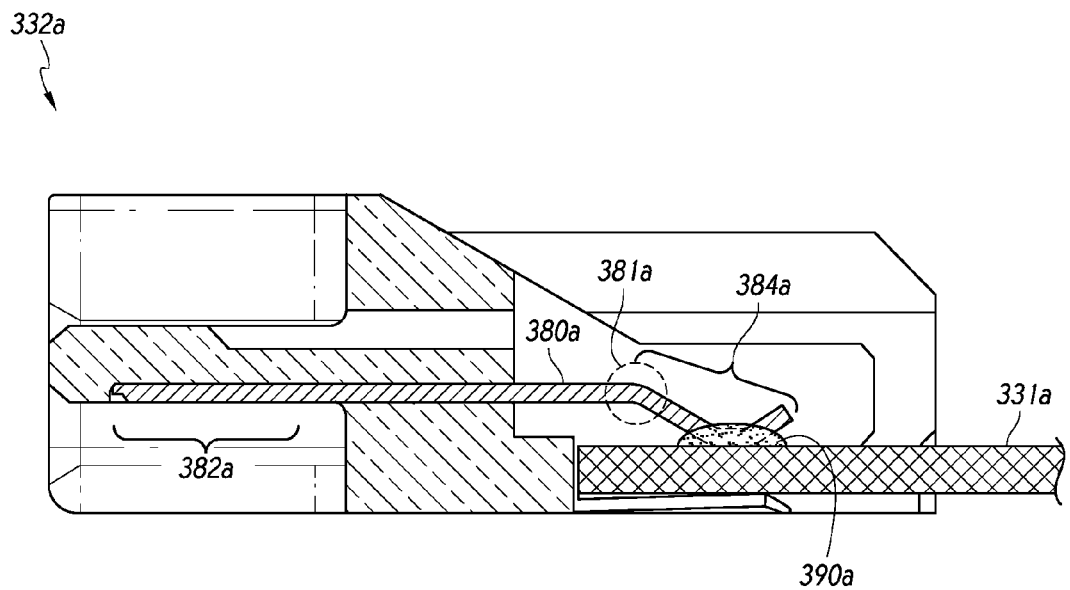
FIGS. 3A-3C provide cross-sectional side views of electrical connectors in accordance with one or more embodiments.
Figure 3B:
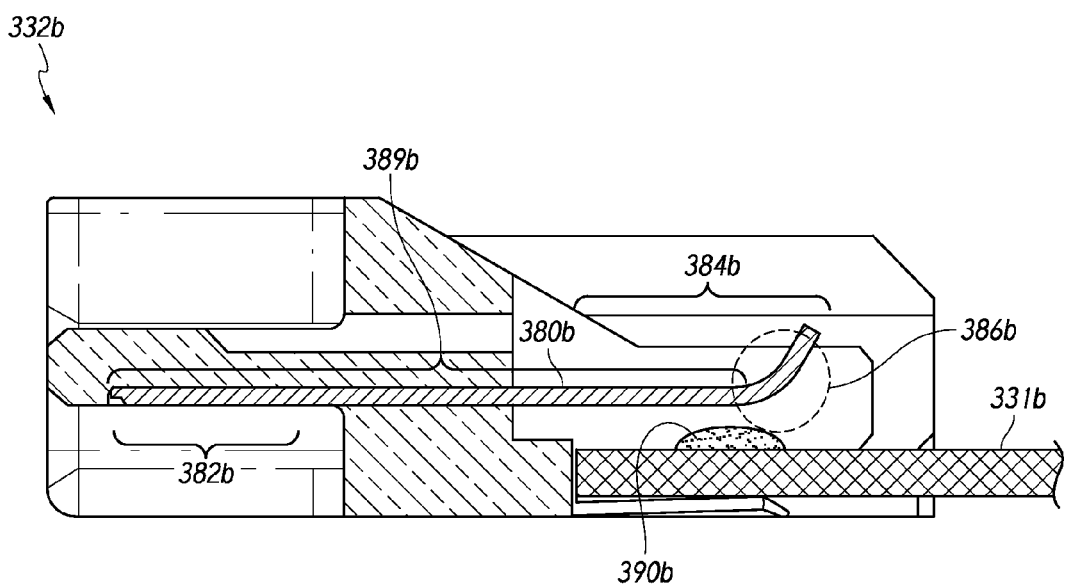
Figure 3C:
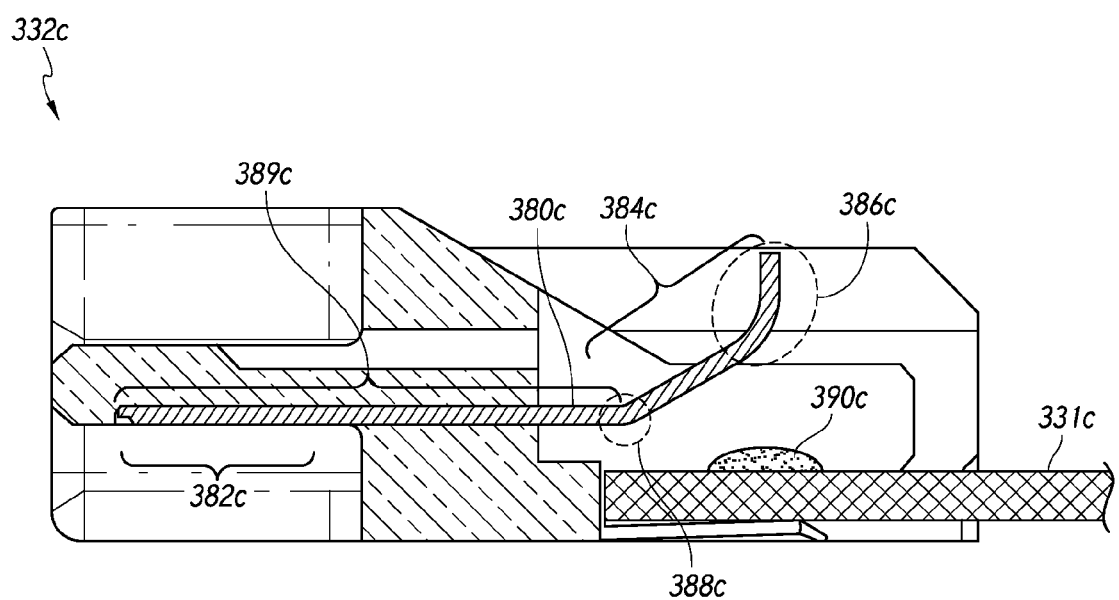

FIGS. 3A-3C provide cross-sectional side views of electrical connectors in accordance with one or more embodiments. FIG. 3A shows a cross-section of an electrical connector 332A that may be connected or mounted to a circuit board 331A. For example, a physical housing of the electrical connector 232A may be fitted or mounted to the board 331A. The electrical connector 332A includes at least one power pin 380A which may include an at least partially exposed power input contact portion 382A. In certain embodiments, the electrical connector 332A may be configured to mate with a connector of an electrical cable or other opposing connector structure configured to physically engage with at least a portion of the electrical connector 332A, such that the power input contact portion 382A may come in substantially close physical contact with an opposing contact portion of a pin or other electrically conductive structure associated with the corresponding mating connector (not shown).

The power pin 380A, which is electrically conductive, may receive power at the power input contact portion 382A and transmit at least a portion of said power to a power output contact portion, which may be part of an output arm 384A of the pin 380A. In the diagram of FIG. 3A, the output arm of the power pin 380A is bent downward toward a top surface of the PCBA 331A in order to come in electrical communication with one or more traces or transmission channels of the PCBA 331A. Electrical communication between the power pin 380A and the PCBA 331A may be effected or facilitated through the use of a bonding agent or electrical connection medium 390A, such as solder or the like. As shown, the power pin 380A is bent downward at a bend portion 381A of the power pin, thereby allowing the power pin 380A to reach downward toward the top surface of the PCBA 331A. Due in part to the bend 381A, in certain embodiments, the power pin 380A may be formed or configured such that the output contact portion of the power pin has a tendency to hold or remain in close proximity to, or in physical contact with, the PCBA 331A, even in the absence of the bonding agent 390A securing the pin 380A to the board 331A. Therefore, the electrical connection between the pin 380A and the PCBA 331A may be generally maintained when the bonding agent 390A becomes melted due to heat in the pin 380A or PCBA 331A.

FIG. 3B shows a cross-sectional side view of the electrical connector 332B comprising a power pin 380B including automatic power disconnection features as described herein. As an alternative to the embodiment illustrated in FIG. 3A, the connector 332B comprises a power pin 380B that is not bent or formed in such a way as to maintain the power output contact portion 386B of the power pin 380B in contact or close physical proximity with the top surface of the PCBA 331B. Specifically, the power pin 380B comprises an elongated substantially straight portion 389B that extends from one distal end of the pin proximal to the power input contact portion 382B towards another distal end proximal to the power output contact portion 386B, which may be substantially curved or hook-shaped, as illustrated in FIG. 3B, and may be similar to the other embodiment illustrated in FIG. 3A.

As configured and shown in FIG. 3B, the power pin 380B is not in electrical contact with the PCBA 331. However, such electrical contact may be achieved by applying a downward pressure towards the top surface of the PCBA 331 and securing the power output contact portion 386B to the top surface of the PCBA 331B. However, in the absence of a secure bonding or mounting by, for example, a bonding agent or electrical connection medium 390B, the power pin 380B may have a tendency to lift the power output contact portion 386B and/or output arm 384B of the power pin 380B away from the top surface of the PCBA 331B due to spring-loading caused by the lack of a downward bend. Therefore, after becoming bonded or secured to the top surface of the PCBA 331B, if the bonding agent or electrical connection medium 390B becomes unstable or compromised to the extent that the power output pin with some amount of force may be removed or dislodged from the connection medium, the power output contact portion 386B and/or output arm 384B may automatically pull out and away from the connection medium 390B, depending on the size shape and/or properties of the connection medium 390B as well as the tensile strength or elasticity of the bin. Such dislodging of the power pin automatically from the connection medium 390B may effectively break or diminish an electrical transmission path through which power is transferred from the power pin 380B to the PCBA 331B. As described above, such automatic engaging or disconnection of power from the PCBA may substantially prevent, or at least partially alleviate, risk or effects associated with overheating of the power pin and/or electrical components disposed on the PCBA 331B and configured to receive power directly or indirectly from the power pin 380B when the power pin is electrically contacting the PCBA 331B.

In certain embodiments, the machine-bent power pins of the connector are pre-bent in such a way that they naturally do not want to contact the PCBA. During PCBA manufacturing, the pins may be temporarily pressed into contact with the PCBA and held there while the soldering phase is completed. After manufacturing, when heat sufficient enough to cause a fire on the connector is encountered, such heat may melt the solder, release the spring contacts, and thereby separate the contacts from the PCBA. This phenomenon disconnects the path between the host supply and the device (e.g., data storage device), thus breaking the power and preventing fire or other damage.

In certain embodiments, the power pin 389B, or one or more power pins associated with any of the embodiments disclosed herein, comprises metal or other conductive material having a relatively low melting point, wherein temperatures above a certain threshold may cause the power pin(s) themselves to melt, thereby providing automatic power disconnection between the connector and the PCBA, which may provide fire-prevention advantages as described herein. Furthermore, certain embodiments provide for use of power pins having relatively high elasticity and/or tensile strength, which may improve the spring-loading of such pins for purposes of disengaging from a board connection under high heat. In addition, certain embodiments may allow for automatic power disconnection at relatively lower temperatures through the use of low-fusion solder, such as solder having a melting point at or below approximately 180° C.

FIG. 3C illustrates a cross-sectional view of an electrical connector 332C according to an embodiment. The connector 332C is configured to provide automatic power disconnection functionality as described herein. The connector 332C includes a power pin 380C that is shaped/formed to automatically disengage from an electrical contact form/medium and pull in a direction away from a surface of an attached PCBA 331C in the event that a bond securing an output contact portion 386C of the power pin 380C to the PCBA 331C becomes compromised or weekend in some respect. For example, in a situation in which the output contact portion 386C is secured to the PCBA 331C by an electrical connection medium or bonding agent 390C, such as solder, excess heat in the power pin 380C may at least partially melt at least a portion of the solder form or ball 390C, thereby at least partially releasing the power output contact portion 386C or other portion of the output arm 384 of the power pin 380C from the bonded connection. The power pin 380C includes a bend feature 388C which provides spring-loading, directing the output arm 384C of the power pin in a direction away from surface of the PCBA 331C. The angle at which the output arm 384C is bent away from the PCBA 331C may be any desirable or suitable angle, wherein, under certain conditions, a greater angle of bend results in a higher degree of spring-loading in the output arm 384C of the power pin 380C, thereby resulting possibly in a stronger disconnection propensity in the power pin 380C.

In view of the bend feature 388C, the power pin 380C can be understood to comprise a power input contact portion 382C, which is configured to allow for electrical connection therewith by a mating connector member of, for example, a cable or other device or structure. The power input contact portion 382C may be part of an elongated substantially straight portion 389C, which is designed or configured to lie in a plane substantially parallel to a top surface of the PCBA 331C when the connector is mounted or secured to the PCBA 331C. The substantially straight portion 389C may span from a first distal end of the power pin 380C disposed proximately to the power input contact portion 382C to the bend feature 388C. The power pin 380C further comprises an output arm 384C which includes the power output contact portion 386C and spans from, at one end, the bend feature 388C to a second distal end portion disposed proximately to the power output contact portion 386C.

While FIG. 3C illustrates a power pin 380C having a single bend feature 388C configured to bend the output arm in a direction away from PCBA 331C, in certain embodiments, the power pin 380C may include a plurality of bend features. For example, a plurality of bend features may be arranged such that, in combination, the additional bend(s) increase the distance and/or angle of separation between the power output contact portion 386C and the PCBA 331C. In addition, although a straight angle is illustrated about the bend feature 388C, wherein the portions of the output arm 384C and substantially straight portion 389C proximal to the bend feature 388C are substantially straight, in certain embodiments, the bend feature 388C may comprise a curvature, such as a substantially continuous curve away from the PCBA 331C along at least a portion of the output arm 384C. Furthermore it should be understood that the present disclosure covers any type or configuration of bend or curve feature in the output arm of a power pin of an electrical connector, wherein such feature increases the separation between the output arm and an attached PCBA and/or provides a spring-loading effect on the output arm such that the output arm has a tendency to pull away from the PCBA surface and/or electrical connection medium in the event that a bond connecting the output arm 384C to the PCBA 331C is weekend to a certain degree.

Method of Attachment

Figure 4:
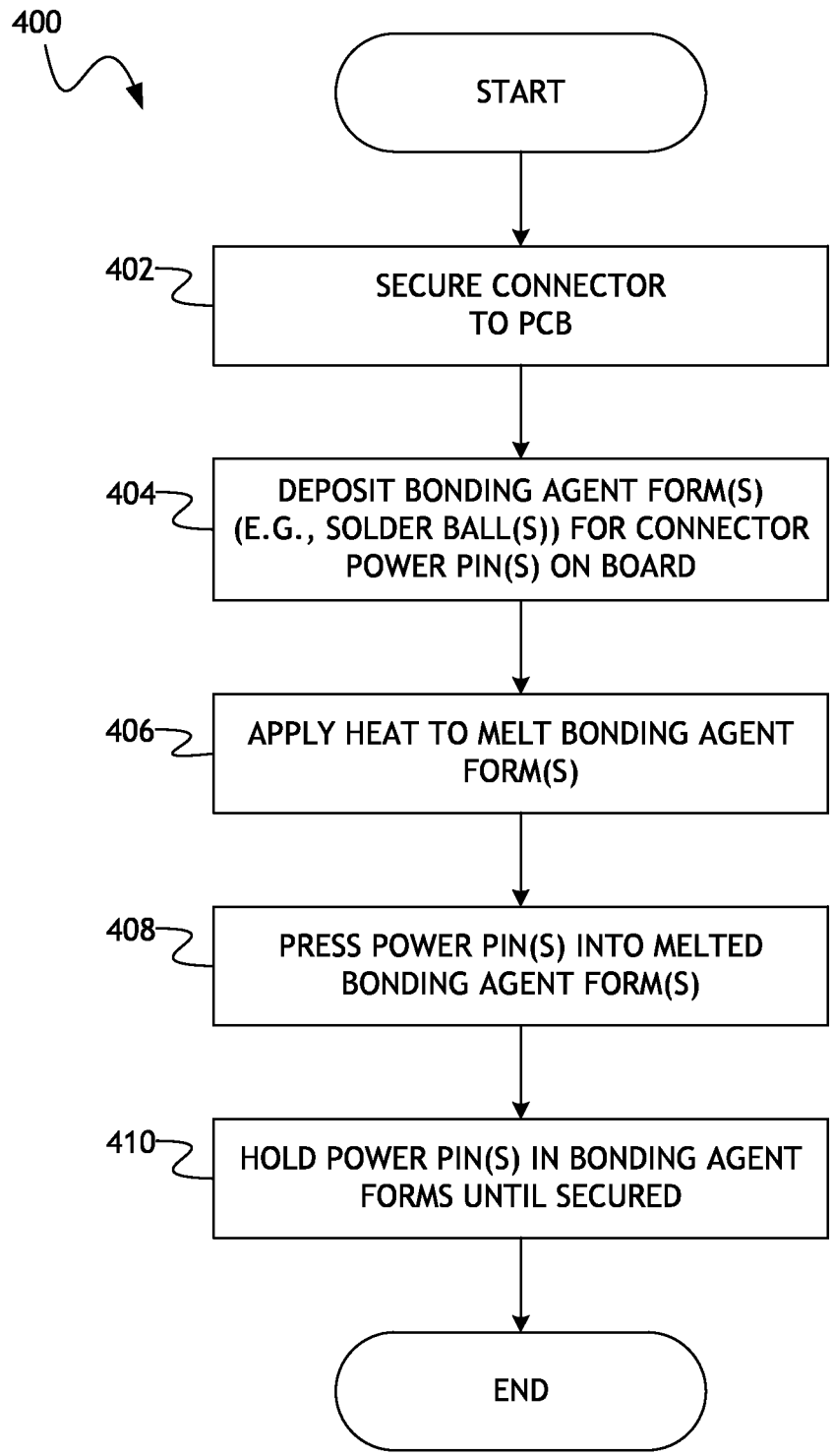
FIG. 4 is a flow diagram illustrating a process of electrically coupling a power pin of an electrical connector to a board.

FIG. 4 is a flow diagram illustrating a process of electrically coupling a power pin of an electrical connector to a board. The process 400 involves securing an electrical interface connector to a printed circuit board (PCB), at block 402. The interface connector may be any suitable connector for providing power and/or data to the PCB from an external power source. For example in one embodiment, the connector is a SATA connector which presents a plurality of data and power pins for providing electrical signals to the PCB from an external source. Furthermore, the interface connector may be secured or mounted to the PCB in any suitable manner, as is well known in the art.

At block 404, the process 400 involves depositing or forming balls or forms of electrical connection medium (e.g., conductive bonding agent) on a top surface of the PCB, the balls or forms positioned and designed for connection of power pins of the electrical interface connector to the PCB. Such deposition or forming of bonding agent forms on the board is performed without the power pins being bonded thereto at the time of deposition or formation. That is, the balls or forms of bonding agent may be allowed to cool and harden prior to ever receiving power pins for bonding therewith.

In certain embodiments the power pins of the electrical interface connector are configured with automatic powered disconnection features as described in greater detail above. For example, one or more of the pins may include one or more bend features causing the power pins to hold a power output contact portion of the pin at an angle away from the attached PCBA. At block 406, the process 400 involves pressing one or more of the power pins downward toward the PCB, and into physical contact with the bonding agent forms, or in proximity thereto. In connection with said pressing, the process 400 involves applying heat to melt or soften the bonding agent forms, at block 408, such that the power pins may be pressed into the forms and penetrate the forms. After the power pins have been submerged at least partially into the melted bonding agent forms, the process 400 involves removing heat from the bonding agent forms and maintaining the power pins in a downward-pressed position at least partially contacting or penetrating the forms until the bonding agent forms cool and/or harden to an extent that the pins are secured and held in electrical contact with the forms, such that strength of the bond is great enough to overcome the opposing force of the spring-loaded output arm to pull away from the PCB as caused by the one or more bend features of the power pin. Therefore, the pins may be secured downward, while having a potential energy directed away from the PCB generated by spring-loading of the pin that causes the power pin have a tendency to pull away from the PCB.

Additional Embodiments

Those skilled in the art will appreciate that in some embodiments, other types of automatic power disconnection systems can be implemented while remaining within the scope of the present disclosure. In addition, the actual steps taken in the processes discussed herein may differ from those described or shown in the figures. Depending on the embodiment, certain of the steps described above may be removed, and/or others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, application-specific integrated circuit (ASIC), field-programmable gate array (FPGA), or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A data storage device comprising:
a printed circuit board (PCB);
an electrical connector at least partially secured to the PCB, the electrical connector comprising:
a housing; and
a power pin disposed at least partially within the housing, the power pin comprising:
a power input contact portion configured to receive power from a communication interface connector;
a substantially straight portion lying in a plane substantially parallel to a top surface of the PCB, the straight portion being connected between the power input contact portion and a bend in the power pin; and
an output arm connected between the bend at a first end and an at least partially curved power output contact portion at a second end, the power output contact portion being configured to be electrically coupled to the PCB via an electrical connection medium; and
an integrated circuit (IC) chip mounted on the PCB;
wherein the data storage device is configured to transmit power received through the power pin to the IC chip via the electrical connection medium and one or more conductive traces of the PCB; and
wherein the bend causes the output arm to lift away from the PCB when a bond between the power output contact portion and the electrical connection medium is broken.

2. The data storage device of claim 1, wherein when the output arm lifts away from the PCB, the data storage device is further configured to cease transmitting power to the IC chip through the power pin.

3. The data storage device of claim 1, wherein the output arm is substantially straight in a portion connected between the bend and the power output contact portion.

4. The data storage device of claim 1, wherein the power output contact portion is substantially hook-shaped.

5. The data storage device of claim 1, wherein the output arm is curved away from the surface of the PCB.

6. The data storage device of claim 1, wherein the power pin includes one or more additional bends configured to cause the bond between the power output contact portion and the electrical connection medium to be broken when the electrical connection medium becomes at least partially melted.

7. The data storage device of claim 1, wherein the electrical connection medium comprises solder, wherein electrical current in the power pin that is greater than a threshold level causes the connection medium to at least partially melt.

8. The data storage device of claim 7, wherein the electrical connection medium comprises low-fusion solder having a melting point below approximately 180° C.

9. The data storage device of claim 1, wherein the output arm is shaped to produce potential energy in a direction substantially away from the PCB when the output arm is pressed in a direction towards the top surface of the PCB, such that when the connection medium melts, the output arm has a tendency to lift away from the PCB, thereby breaking an electrical connection with the PCB.

* * * * *